United States Patent [19]

Leibovitz et al.

[11] Patent Number: 5,399,528
[45] Date of Patent: Mar. 21, 1995

[54] MULTI-LAYER FABRICATION IN INTEGRATED CIRCUIT SYSTEMS

[76] Inventors: Jacques Leibovitz, 1536 Larkspur Dr., San Jose, Calif. 95125; Maria L. Cobarruviaz, 10825 Stevens Canyon Rd., Cupertino, Calif. 95014; Kenneth D. Scholz, 4150 Willmar Dr., Palo Alto, Calif. 94306; Clinton C. Chao, 51 Waterside Cir., Redwood City, Calif. 94065

[21] Appl. No.: 37,476

[22] Filed: Mar. 24, 1993

Related U.S. Application Data

[63] Continuation of Ser. No. 727,716, Jul. 10, 1991, abandoned, which is a continuation-in-part of Ser. No. 360,828, Jun. 1, 1989, Pat. No. 5,055,425.

[51] Int. Cl.$^6$ ............................................. H01L 21/44
[52] U.S. Cl. .................................. 437/195; 437/228; 437/225; 156/643
[58] Field of Search .................... 437/195, 228, 225; 156/636, 643; 51/131.4, 293

[56] References Cited

U.S. PATENT DOCUMENTS

| | | | |
|---|---|---|---|
| 3,436,259 | 4/1969 | Regh et al. | 117/227 |
| 3,951,710 | 4/1976 | Basi | 156/642 |
| 3,977,130 | 8/1976 | Degner | 51/131 |
| 4,313,284 | 2/1982 | Walsh | 51/131.4 |
| 4,671,851 | 6/1987 | Beyer et al. | 437/249 |
| 4,789,648 | 12/1988 | Chow et al. | 437/228 |
| 4,840,923 | 6/1989 | Flagello et al. | 437/203 |
| 4,910,155 | 3/1990 | Cote et al. | 437/228 |
| 4,956,313 | 9/1990 | Cote et al. | 437/228 |
| 4,962,058 | 10/1990 | Cronin et al. | 437/228 |
| 4,962,064 | 10/1990 | Haskell et al. | 437/228 |
| 5,069,002 | 12/1991 | Sandhu et al. | 156/636 |
| 5,084,071 | 1/1992 | Nenadic et al. | 51/293 |
| 5,104,828 | 4/1992 | Morimoto et al. | 156/636 |
| 5,232,875 | 8/1993 | Tuttle et al. | 156/636 |
| 5,234,867 | 8/1993 | Schultz et al. | 156/636 |

*Primary Examiner*—Brian E. Hearn
*Assistant Examiner*—Tuan Nguyen

[57] ABSTRACT

A method for fabricating layers permits the accurate removal of surface material in a multi-layer multi-chip carrier. An intermediate layer of solid vias is deposited over a circuit layer attached to a substrate. The layer can be filled with a dielectric material. The substrate is attached to a substrate holder such that the intermediate layer is exposed, and the substrate holder is placed onto a rotating platen polisher with the intermediate layer facing the platen surface. Tooling presses the intermediate layer against the rotating polishing platen, allowing the substrate holder and substrate to rotate with three degrees of angular freedom, letting the substrate and intermediate layer self-align to the polishing platen in order to uniformly remove material from the intermediate layer surface. A second circuit layer can be formed on the resulting structure. The foregoing steps can be iterated to build a multi-layer structure of circuit layers separated by uniformly thick dielectric and via layers. As an alternative method, substrate attached to a substrate holder is placed against the platen surface of a shaking polisher, allowing the substrate and substrate holder to self-align to the polishing platen. In a third embodiment, where metal irregularities exist along the intermediate layer surface, wiping the surface evenly with cloth soaked in an appropriate etchant can uniformly remove the unwanted metal irregularities.

5 Claims, 7 Drawing Sheets

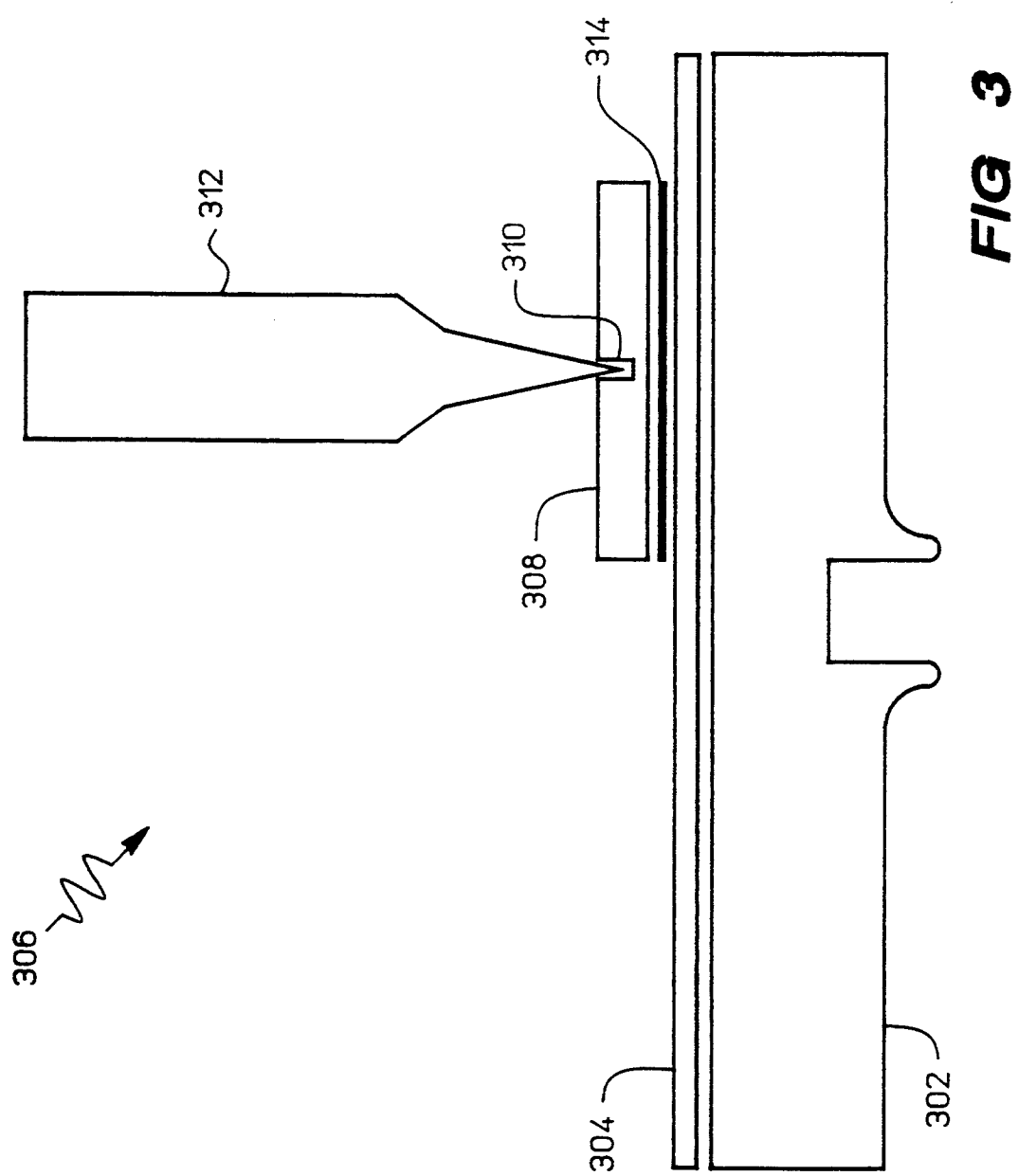

MULTI-LAYER FABRICATION IN INTEGRATED CIRCUIT SYSTEMS

CROSS REFERENCE TO RELATED APPLICATION(S)

This is a continuation of copending application serial number 07/727,716 filed on Jul. 10, 1991, now abandoned, which is a continuation-in-part of a U.S. application, Ser. No. 07/360,828, filed Jun. 1, 1989, now U.S. Pat. No. 5,055,425. The present invention relates to integrated circuits and, more particularly, to a method of fabricating layers on integrated circuit substrates. A major objective of the present invention is to provide for high-density multi-chip carriers.

BACKGROUND OF THE INVENTION

Much of recent technological progress embraces the increasing miniaturization afforded by advances in integrated circuit processing technology. Dramatic improvements in the circuit density available on individual integrated circuit chips have been made. Typically, integrated circuit chips are individually packaged and the packages are mounted on printed circuit boards. The sizes of the packages limit chip density on the printed circuit board, requiring larger systems and limiting overall circuit performance due to longer inter-chip connections.

More recently, multi-chip carriers have been developed which permit multiple integrated circuit chips to be mounted on a common carrier without the need for packaging the individual chips. This allows the chips to be packed more closely together.

While multi-chip carriers have been fabricated using a variety of technologies, the greatest chip density has been achieved by multi-chip carriers fabricated using integrated circuit processing technology. In other words, a multi-chip carrier can be fabricated by photolithographically defining multiple layers of circuits interconnected by metal vias through intermediate dielectric layers. Individual integrated circuit chips attach to the upper layer of the multi-chip carrier and receive and transmit electrical signals through the multi-chip carrier's circuit layers and vias.

The vias which carry electrical signals from one circuit layer to another are typically formed as follows. Apertures are photolithographically defined in a dielectric layer deposited over a lower circuit layer. Copper vias are then formed in these apertures by sputtering or by chemical vapor deposition. Copper is the preferred via material because of its excellent conductivity and current-carrying capacity; however copper does not bond effectively with dielectrics and requires a distinct adhesive layer, e.g., chromium, to bond the copper to the dielectric. Aluminum bonds readily with dielectrics without an intermediate adhesion layer, and for this reason is also sometimes used.

The vias formed by conventional sputtering or chemical vapor deposition are hollow. Hollow vias cannot be stacked through successive layers because of attendant photolithographic difficulties. Specifically, a photoresist layer follows the curvature of the hollow via's surface. The resulting curvature causes deviations in the collimated light beam used to define patterns in the photoresist; these deviations prevent certain regions of the photoresist from being exposed, and conversely, expose other regions that must not be exposed, so that the desired pattern for the next circuit layer cannot be formed.

To address these problems, vias can be offset through individual layers to provide multi-layer interconnections. The pattern of vias through the individual circuit layers resembles a set of steps, which require extra space. The spreading of the vias across the layers limits the circuit density of the carrier and thus the density with which chips can be arranged on the carrier. In addition, the less dense arrangement requires longer signal paths, characterized by higher impedance and longer signal travel time.

Techniques and processes for constructing solid vias within multi-chip carriers have been disclosed in a parent patent application (Ser. No. 07/360,828). While the disclosed methods provide greater via and circuit density within multi-chip carriers, the techniques can become severely degraded from the surface topology of individual circuit layers. Excess and uneven via material, remaining after each fabrication iteration, results in irregular surface topology that makes further alignment and photolithography difficult, if not impossible. Irregular topological features would only worsen as each successive layer is attached to the previous. What is needed is a method of improving the surface topology of integrated circuit surfaces in order to align and stack individual circuit layers accurately. More specifically, what is needed is a method of fabricating a layer of vias with an improved, uniform surface topology, while leaving delicate multi-chip carrier structures intact.

SUMMARY OF THE INVENTION

In accordance with the present invention, a method provides for the fabrication of multi-layer integrated circuit devices having improved surface topology. The method combines novel dielectric and circuit layer fabrication techniques with planarization methods to ensure accurate alignment and fabrication of successive layers. Planarization steps include polishing layers while maintaining orientation accuracy in order to remove excess layer material evenly, resulting in a smooth, uniform surface topology. The inventive method provides for several alternative mechanical polishing techniques, and a third alternative chemical polishing method, to achieve the same desired precision planarization.

The steps and objectives of the fabrication method are described in the context of processing semiconductor wafers into integrated circuits and multi-chip carriers. The first general step of the inventive method forms a first circuit pattern on a substrate, here a semiconductor wafer. In the second step, an intermediate layer is deposited upon the first circuit pattern. In the case of multi-chip carrier fabrication, the intermediate layer consists of a dielectric that electrically separates one circuit pattern from another. Spaced columns of metal, or vias, are imbedded within the intermediate layer to selectively join circuits of one layer to circuits of the next layer. In the next sequence of steps, the intermediate layer is polished accurately in order to place the next circuit layer over the intermediate layer. In a third step, the wafer with the unpolished intermediate layer is attached to a substrate holder, to hold the semiconductor wafer rigid and flat, while exposing the intermediate layer.

In a fourth step, the substrate holder is placed onto a rotating polishing platen surface such that the upper exposed surface of the intermediate layer contacts the platen surface. Tooling presses the substrate holder and substrate against the platen, while allowing the holder to rotate with three degrees of angular freedom. In a fifth step, the platen is turned on, polishing a thin layer from the intermediate layer. After inspection, polishing is repeated as necessary until the required amount of material has been removed. The semiconductor substrate is then removed and cleaned for further processing. The next circuit can now be deposited onto the flat intermediate layer. The process of applying circuit and intermediate layers and polishing the layers flat can be repeated until the desired layered structure is achieved.

In an alternative mechanical polishing embodiment, after repeating the same first three steps as above, the substrate, attached to a flat substrate holder, is placed onto a shaking polishing platen surface such that the upper exposed surface of the intermediate layer contacts the platen surface. In a fifth step, the platen is turned on, polishing a thin layer from the intermediate layer. After inspection, polishing is repeated as necessary until the required amount of material has been removed. The semiconductor substrate is then removed and cleaned for further processing as described above.

In a third alternative, the substrate is held against a vacuum chuck. An etchant capable of removing the unwanted surface material is wiped against the upper surface of the substrate. After inspection, wiping with the etchant is repeated as necessary until the required amount of material has been removed. The semiconductor substrate is then removed from the vacuum chuck and cleaned for further processing as described above. This alternative is useful when an etchant exists for the particular excess surface material. In addition, this alternative polishing method is conformal, and therefore effective on surfaces with small curvatures.

The methods and apparatus of the present invention provide a flexible system for accurately fabricating uniform layers on semiconductor and other surfaces. The present invention allows the removal of material to any depth while maintaining the inherent planarity of the underlying substrate. The present invention provides methods for improving the surface topology of integrated circuit surfaces in order to align and stack individual circuit layers accurately. In addition, the methods allow fabricating layers of vias with an improved, uniform surface topology, while leaving delicate multi-chip carrier structures intact. These and other features and advantages of the present invention are apparent from the description below with reference to the following drawings.

BRIEF DESCRIPTION OF THE DRAWINGS

FIG. 3 illustrates the polishing of substrate surfaces with a very high degree of orientation accuracy, using metallographic or wafer polishing equipment and a substrate holder designed with three degrees of angular freedom which forces the substrate surface to automatically align to the polishing platen surface, in accordance with the invention.

DESCRIPTION OF THE PREFERRED EMBODIMENTS

Figure 1G:
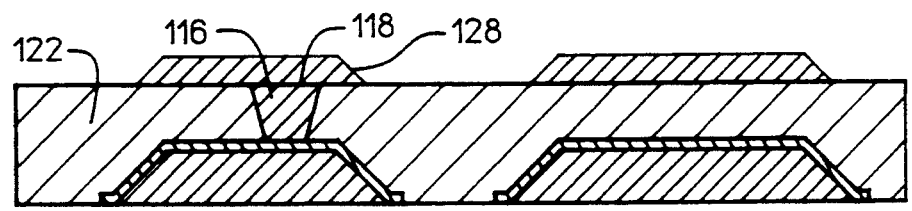
FIGS. 1A–1G represent stages in the fabrication of a structure including a solid via in accordance with the present invention.
Figure 1F:
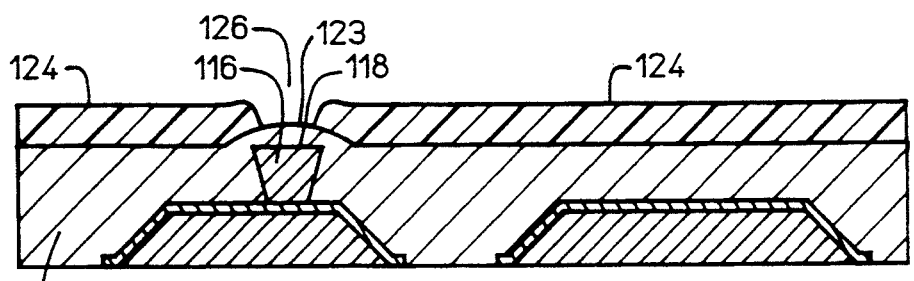
Figure 1E:
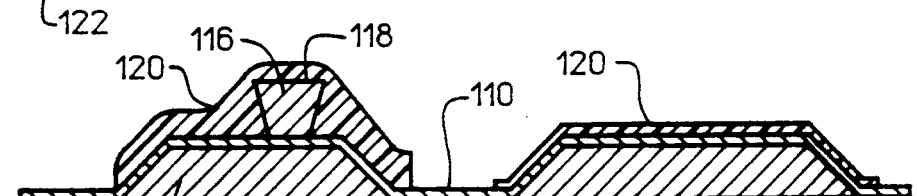
Figure 1D:
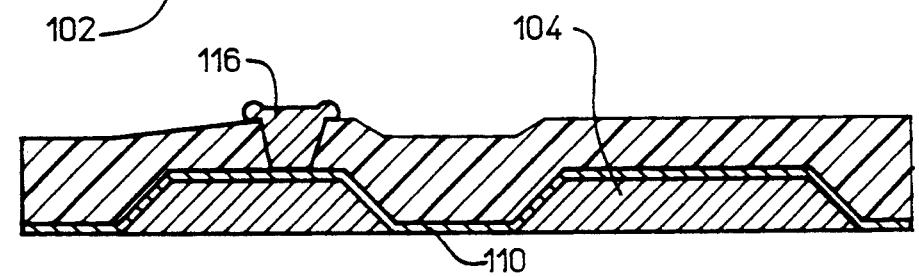
Figure 1C:
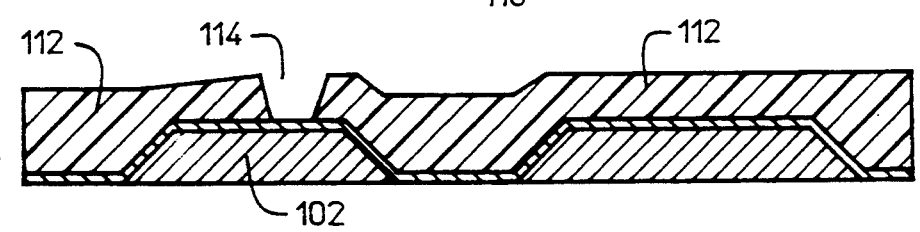
Figure 1B:
Figure 1A:
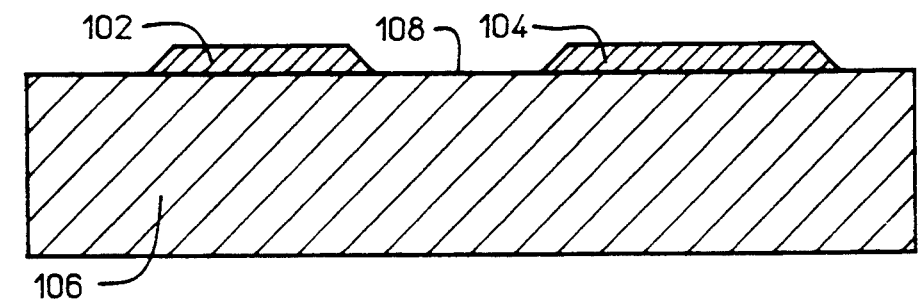
Figure 2:
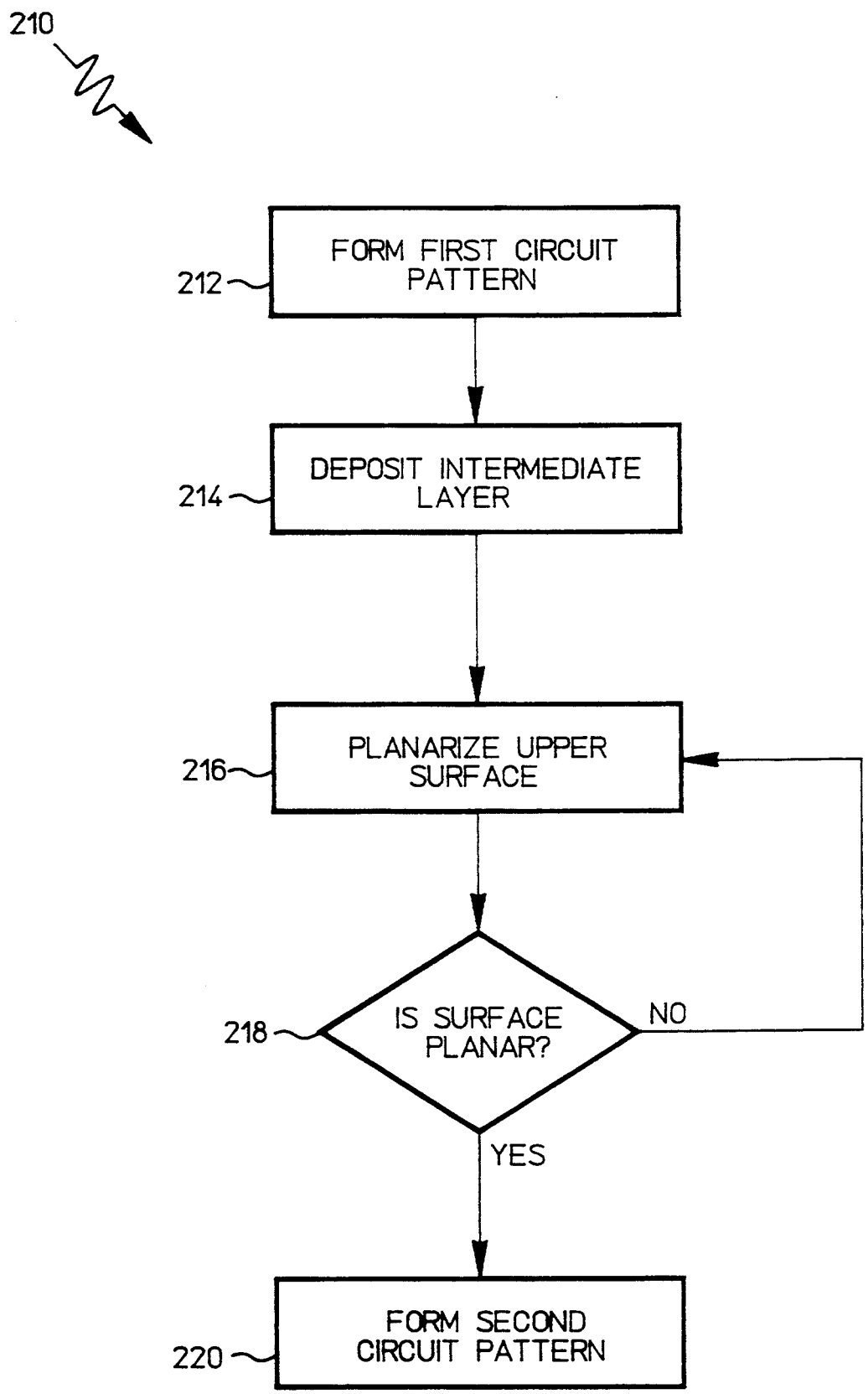
FIG. 2 is a flow diagram illustrating the fabrication of a multilayer structure in accordance with the present invention.

In accordance with the present invention, a method for fabricating layers on semiconductor substrates is described in the context of a method for forming stacked solid copper vias as illustrated in FIGS. 1A–1G. The general procedure 210 is shown in FIG. 2. FIG. 1A represents a starting point for the present invention and shows copper (Cu) lines 102 and 104 formed (step 212, FIG. 2) on a silicon substrate 106, the upper surface 108 of which has been oxidized to form a silica layer. A thin chromium (Cr) layer can be used to bond copper lines 102 and 104 to surface 108.

A thin composite layer 110 is deposited over the structure of FIG. 1A, resulting in the structure of FIG. 1B. (The silicon substrate 106 is omitted from FIGS. 1B–1G.) Composite layer 110 comprises a copper center layer sandwiched between chromium adhesion layers. Composite layer 110 serves to conduct electricity for a subsequent electroplating step. A photoresist layer 112 is then deposited over the structure of FIG. 1B. Using standard photolithographic techniques, an aperture 114 is formed through photoresist layer 112 and over line 102 to define the location for a subsequently formed via, resulting in the structure of FIG. 1C.

Aperture 114 is filled with copper in an electroplating step, completing step 214, to form solid via 116 as shown in FIG. 1D. A polishing step 216 removes excess copper so that the via top surface 118 is planar, and the photoresist layer 112 is removed (as indicated in FIG. 1E). A new layer of photoresist 120 is deposited and patterned to form a protective mask over lines 102 and 104 and via 116, as shown in FIG. 1E. Then, the exposed portions of composite layer 110 are etched away.

Photoresist 120 is next stripped and a polyimide layer 122 is formed over and around the remaining structure of vias. After curing the polyimide coating, another photoresist layer 124 is deposited over polyimide layer 122. An aperture 126 is defined through photoresist layer 124 over via 116, resulting in the structure of FIG. 1F. The exposed polyimide is etched away through aperture 126 using a reactive ion etch. This exposes the top of the via for subsequent connection, and the photoresist remaining after the reactive ion etch is removed, resulting in the structure of FIG. 1G. While the polyimide layer and vias have been constructed according to a preferred embodiment, those skilled in the art will appreciate that other methods and techniques can be used as well.

The structure of FIG. 1G can become the substrate for the next iteration of the procedure. A second layer interconnect pattern 128 is constructed, step 220, on the top surface of the new substrate surface. The second layer interconnect pattern 128 can include both lines and vias formed concurrently with the lines. Some of the vias formed in the first iteration will connect to lines in this second layer interconnect pattern; other vias in the first dielectric layer will require electrical contact with more distant lines through intermediate and stacked vias in the second and subsequent dielectric layers. A second dielectric layer with vias therethrough can be formed using a second iteration of the process described with reference to FIGS. 1B–1G. After several iterations, the resulting structure will comprise alternating interconnect and dielectric layers, both of which can include vias.

Figure 7:
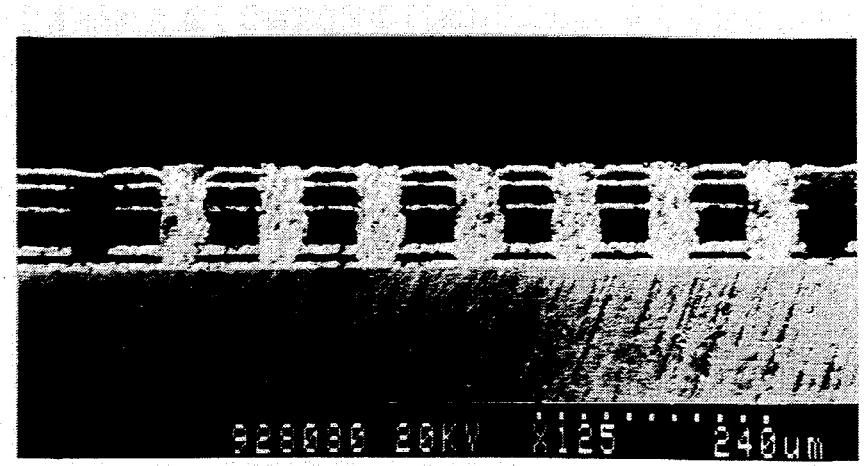
FIG. 7 is a microscope picture of the cross section of four levels of stacked solid copper vias, 40 $\mu$m in diameter, in a polyimide and copper structure of five metal layers, fabricated in accordance with the invention, using a third planarizing method.

The solid copper vias shown in FIG. 7 were fabricated using the described methods, in accordance with this invention. The polyimide/via layers were planarized using a chemical polishing step, representing a third embodiment of the present invention.

As discussed, in accordance with the preferred embodiment of the invention, a layer of solid copper vias and studs is formed first, and the surrounding polyimide is formed afterwards. Once the polyimide/via layer has been formed, one of three polishing methods can be employed to planarize the upper surface for the construction of further layers. The corresponding steps of the process are recapitulated below.

The cross sections of the product corresponding to the successive steps are illustrated in FIGS. 1A–G. The first metal layer 102–104 can be formed over substrate 106 by first depositing a Cr/Cu/Cr metallization, FIG. 1A, then patterning it by masking with photoresist, selective etching of the successive metals and stripping the photoresist. The two 0.05 μm thick chromium layers provide adhesion. In accordance with the invention, the Cr/Cu/Cr metallization for the first metal layer is formed as described above such that the solid copper vias and studs are formed before the bottom metal layer (providing electrical connection during electroplating) is etched away. Accordingly, the processing proceeds as follows:

A. Deposit a Cr/Cu/Cr metallization 0.2 to 1.0 micrometer thick, FIG. 1B. Metallization layer 110 serves to conduct the electrical current during the subsequent electroplating step. The chromium layers are 0.05 μm thick and mainly provide copper adhesion.

B. Mask metallization layer 110 with photoresist 112 (i.e., spin, dry, expose, develop, hard bake), such as to expose the metallization where the copper vias or studs are to be built. The thickness of the photoresist should equal the height of the planned copper via to be deposited in apertures 114, FIG. 1C.

C. Selectively etch away the exposed chromium at the bottom of aperture 114, and electroplate copper 116 to fill apertures 114 in photoresist 112. Note the resulting overfill of vias 116, FIG. 1D.

D. Polish via surfaces 118 (using polishing methods described below) and strip photoresist layer 112, and then mask the copper lines, vias and studs with new photoresist 120, FIG. 1E.

E. Strip the exposed regions of the thin metallization layer 110 which served to conduct the electroplating current in preceding step C, and strip photoresist layer 120.

F. Deposit polyimide layer 122. The polyimide deposition process involves dry baking and plasma cleaning the substrate. Next, polyimide precursor solution is spun onto the substrate, and spun dry. Then, the wafer is soft baked to obtain a B-phase polyimide layer. The photoresist layer 124 is masked in order to provide openings 126 atop the vias 116, FIG. 1F, and then polyimide bulges 123 atop vias 116 are etched back. Photoresist layer 124 is stripped and finally, polyimide layer 122 is cured, FIG. 1G.

Each following intermediate layer of metal circuit paths and interconnecting vias (or studs) is fabricated similarly. As mentioned, the stacked vias shown in FIG. 7 were fabricated according to the above via procedure.

As revealed in parent application, Ser. No. 07/360,828, alternative methods of forming stacked solid copper vias and heat conducting studs in polyimide/copper structures can also be implemented to provide high-performance multi-chip modules (MCMs). While forming the polyimide/via layer by the alternative procedure, the alternative method still requires adequate techniques for accurately planarizing the top layer, on which to form further layers.

The fine, accurate polishing and planarization of the via and dielectric surfaces is a critical procedural step for the present invention. A silicon wafer can be on the order of 100,000 μm across, yet the top layer of the vias and studs (i.e., the irregular layer which needs to be polished flat) can be only 5 μm thick. The thinness, planarity and parallelism of the collective layer of vias/studs and the small amount of material needed to be removed strain conventional methods of polishing. In accordance with the invention, a method, tooling and procedure are provided to maintain the silicon substrate, with its newly formed layer of vias and studs, at a slope smaller than 1/100,000 relative to the polishing platen during each mechanical polishing operation.

The invention employs a substrate holder designed with three degrees of angular freedom, thus forcing the substrate to automatically self-align to the rotating polishing platen surface. The self-alignment serves to evenly remove material from the upper surface of the substrate, while maintaining the slope of the front surface. The equipment and tooling used, as shown in FIG. 3, includes a rotating polisher (for example, a Polimet polisher from Buehler, which is not shown), platens 302 and discs 304 bearing the requisite fine polishing grits for use on the polisher, and a substrate holder 306 with three degrees of angular freedom. There are many ways to design for three degrees of angular freedom.

In one embodiment, the holder comprises a cylindrical mass and a rod. The cylindrical mass 308 can be machined from brass to a diameter somewhat larger (for example, 0.5" larger) than that of the silicon substrate 314. Cylinder 308 has an axial hole 310 (0.17" in diameter, for example), which preferably does not penetrate the entire cylinder. Rod 312 has a tapered end of proper length, such that, when rod 312 is inserted into cylinder hole 310, it is stopped by the hole's rounded edge before the end of rod 312 reaches the bottom of hole 310. Other embodiments include alternative designs possessing three angular degrees of freedom such as a ball joint, a universal joint coupled to a bearing, etc.

The polishing and planarizing procedure proceeds as follows. First, the back of substrate 314 is attached against the smooth end of cylinder 308 (i.e., the end surface without the hole). As known in the art, wafers tend to bow as various metal and dielectric layers are added to the silicon substrate. To eliminate the bow during the polishing step, the wafer is laid onto the brass cylinder 308, which has had a thin layer of beeswax applied to its surface. A lint-free cloth separates the upper surface of the wafer 314 from another flat block. The flat block presses and flattens the wafer to the brass cylinder 308 in a heating and cooling step, during which the beeswax melts and attaches the wafer to the cylinder block, resulting in a high degree of flatness.

Second, the polishing platen rotation speed control is set to zero and the substrate/cylinder assembly is placed face down on the platen, off-center, as shown in FIG. 3. The platens are used in graded sequence from the coarse to the fine polishing grit, with customary cleaning procedures employed at each platen change to avoid cross-contamination. Next, the tapered end of rod 312 is inserted into cylinder hole 310. Holding rod 312 nearly vertically, and using it to control the position of the substrate surface on the platen, the platen rotating speed control is gradually increased from zero to the desired speed. The increase in linear speed with distance from the platen center causes substrate 314 and cylinder block 308 assembly to rotate, thus distributing the polishing action uniformly over the substrate surface.

After the desired polishing time, the platen rotating speed control is gradually decreased to zero. The assembly is then removed, rinsed, dried and examined. Based upon the examination of the wafer surface, more polishing is carried out at the same grit grade or the sample is thoroughly cleaned in an ultrasonic bath, the platen changed to the next grade, and polishing resumed until polishing is completed.

Figure 4A:
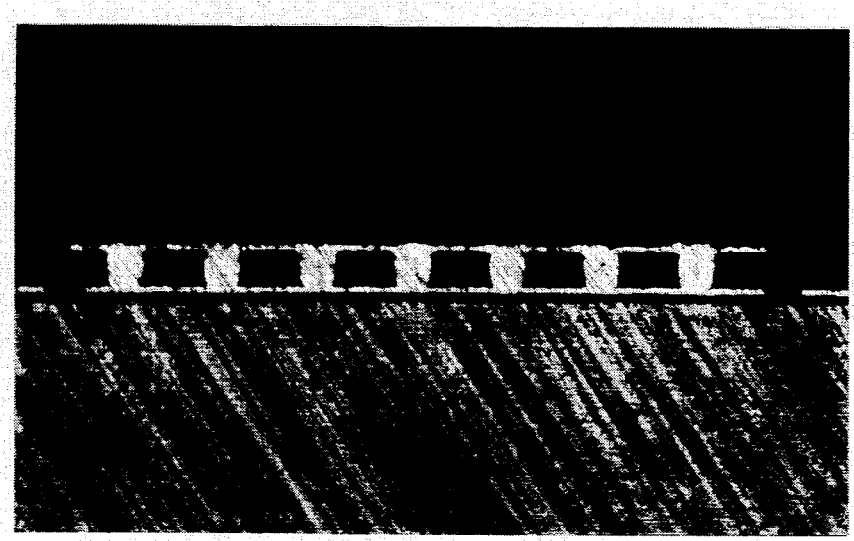
FIG. 4A and 4B are microscope pictures of the cross section of solid copper vias, 40 micrometers ($\mu$m) in diameter, 40 $\mu$m tall built in a polyimide/copper structure and polished in accordance with the present invention, using a first planarizing method.
Figure 4B:
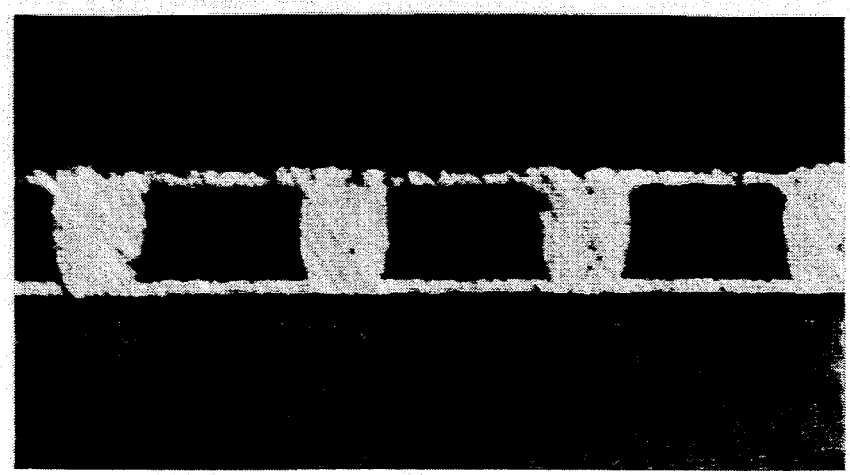

The surfaces of the solid copper vias shown in FIGS. 4A and 4B were fabricated in accordance with the described fabrication procedure, in accordance with the first embodiment of the invention. The above described polishing requires starting with the substrate material initially planarized, but this requirement can be relaxed by the use of padded platen surfaces (which carry the polishing grit).

In accordance with the invention, an alternative mechanical polishing method, tooling and procedure are provided to inherently maintain the substrate during the polishing operation at a slope smaller than 1/100,000 relative to the polishing platen. Instead of holding the substrate and wafer over a rotating polishing platen, the alternative method employs a substrate holder designed to "float" the substrate, face down at the desired pressure, on a shaking polishing platen surface such that the substrate surface inherently self-aligns to the shaking platen. The tooling and procedures are described below.

Figure 5:
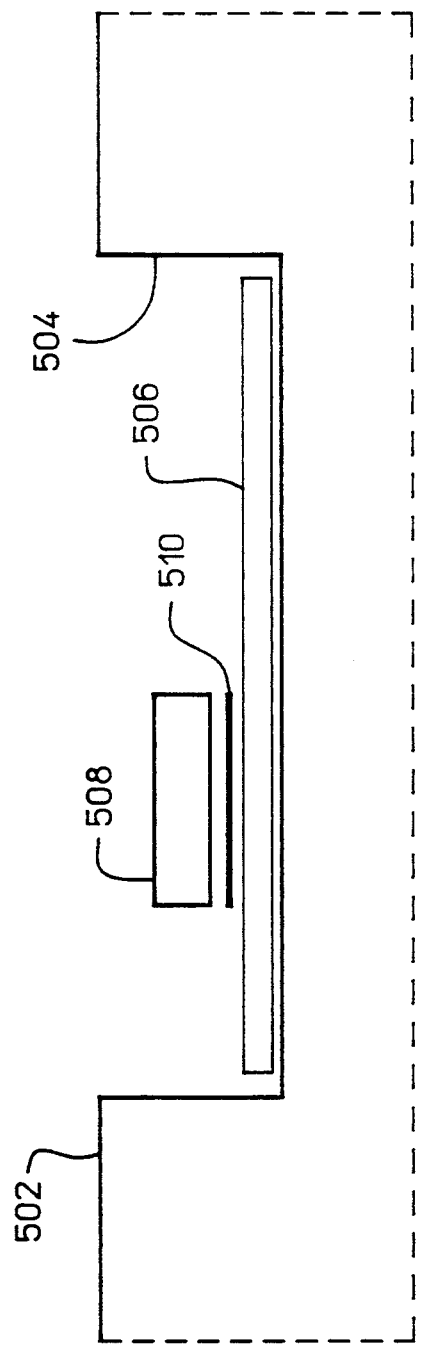
FIG. 5 illustrates the polishing of substrate surfaces with a very high degree of orientation accuracy, using shaking polishing equipment and a substrate holder which maintains the substrate surface aligned to the polishing surface, in accordance with the invention.

The equipment and tooling for the alternative mechanical polishing, shown in FIG. 5, includes a shaking polisher 502 (for example from Labtone), a polisher well 504 for each requisite polishing grade grit, a hard flat surface 506 (flat glass, for example) fitting the bottom of each polisher well, and a substrate holder 508, similar to that described above (made from brass, shaped approximately 0.5" larger in diameter than the substrate 510 which it holds). The density and height of the holder determines the polishing pressure.

Figure 6A:
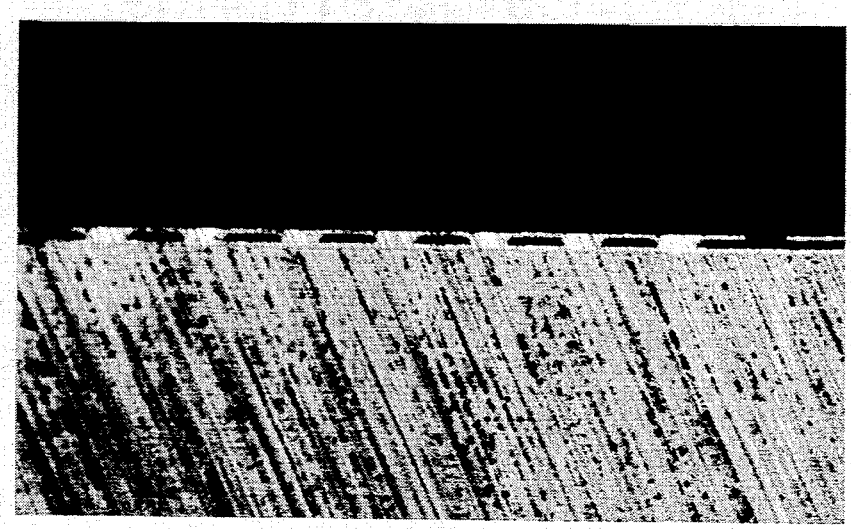
FIGS. 6A and 6B are microscope pictures of the cross section of solid copper vias, 40 $\mu$m in diameter, 10 $\mu$m tall built in a polyimide/copper structure in accordance with an alternative method of fabricating solid vias, using a second planarizing method.
Figure 6B:
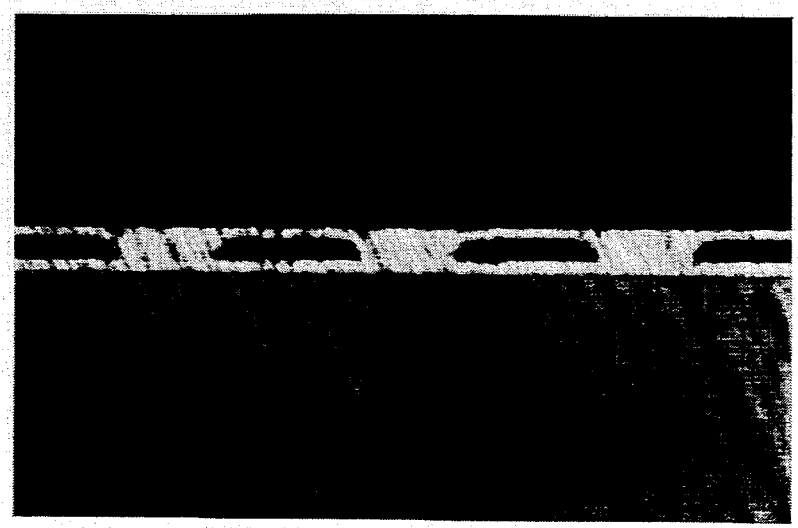

The alternative mechanical polishing proceeds as follows. First, the back of the substrate 510 is waxed flat against a cylinder end surface of substrate holder 508, as described above. Next, polisher 502 is switched off and the substrate 510 and cylinder 508 assembly is placed face down on platen 506. Several such assemblies can be placed on the platen for simultaneous polishing. The wells 504 (and hard flat surfaces 506) are used in graded sequence from coarse to fine polishing grit, using customary cleaning procedures at each change to avoid cross-contamination. Then, the polisher 502 is switched on. After the desired polishing time, the polisher is switched off. The assembly is removed, rinsed, dried and examined. Based upon the examination, more polishing is carried out at the same grit grade, or the sample is thoroughly cleaned in an ultrasonic bath, the well and platen changed to the next grade, polishing resumed, and so on until polishing is completed. The solid copper vias of FIGS. 6A and 6B were fabricated in accordance with this procedure, being a second embodiment of the invention.

In a third embodiment of the inventive polishing method, tooling and procedures are provided for polishing the final copper layer above the substrate surface without the imposition of the stringent requirements on orientation inherent to the mechanical polishing methods described above. The tooling for the third embodiment includes an acid-resistant plate (for example, of polypropylene), lint-free pieces of cloth soaked with graded strengths of copper etchant (Transene CE-200, as an example), and a substrate holder (for example, a hand-held vacuum chuck).

The third inventive procedure begins by flattening the soaked cloth against the plate surface, while the substrate is held by its back on the vacuum chuck. Next, the substrate/chuck assembly is placed with the substrate face-down on the flattened cloth, and moved about, thus continuously wiping the substrate surface against the soaked cloth. The soaked cloths are used in graded sequence from stronger to weaker etchant strength. After the desired polishing time, the assembly is removed and immediately rinsed, dried, and examined. Based upon the examination, more polishing is carried out at the same etchant strength or the soaked cloth is changed to the next etchant strength, and polishing resumed and so on until polishing is completed.

The solid copper vias shown in FIG. 7 were polished in accordance with the third embodiment of the invention. FIG. 7 shows a microscope picture of the cross section of four levels of stacked solid copper vias, 40 $\mu$m in diameter, in a polyimide/copper structure of five metal (interconnect) layers. The dielectric layers are, from the bottom, 10, 40, 20 and 15 $\mu$m thick, respectively.

The present invention, applying unique polishing techniques to novel via and stud fabrication, can be applied in the fabrication of integrated circuit chips as well as in the fabrication of multi-chip carriers. As is apparent to those skilled in the art, many modifications to the disclosed embodiment can be made while retaining the essential features of the invention. The present invention provides for substrates other than silicon, e.g., a metal, a metal with a dielectric layer, or a flexible substrate such as a polyimide film. The lines can be copper, silver, gold, or platinum. The conducting layer can include the same range of metals as the lines, as can the vias. The dielectric layer can be of alumina, silica, etc. These and other variations upon and modifications to the described embodiments are provided for by the present invention, the scope of which is limited only by the following claims.

What is claimed is;

1. A method of fabricating a multilayer integrated circuit comprising the steps of:
   a) forming a first circuit pattern on a first surface of a substrate;
   b) depositing an intermediate layer on said first circuit pattern;
   c) polishing an exposed surface of said intermediate layer so as to planarize it, said polishing involving
      1) attaching said substrate to a substrate holder
      2) placing said substrate holder onto a polishing platen surface so that said exposed surface of said intermediate layer contacts said platen surface,
      3) rotating said platen while holding said substrate holder to permit said substrate to move with three degrees of angular freedom such that the first surface of the substrate automatically self-aligns to the polishing platen surface during polishing; and
   d) forming a second circuit pattern on said substrate.

2. A method for fabricating a multilayer integrated circuit comprising the steps of:
   a) forming a first circuit pattern on a substrate;
   b) depositing an intermediate layer on said first circuit pattern;
   c) polishing an exposed surface of said intermediate layer so as to planarize it, said polishing involving
      1) attaching said substrate to a substrate holder,
      2) placing said substrate holder onto a polishing platen surface so that said exposed surface of said intermediate layer contacts said platen surface; and
      3) shaking said polishing platen surface so that said holder and said substrate move relative to said polishing platen surface; and
   d) forming a second circuit pattern on said substrate.

3. A method for fabricating a multilayer integrated circuit comprising the steps of:
   a) forming a first circuit pattern on a substrate;
   b) depositing an intermediate layer on said first circuit pattern;
   c) polishing an exposed surface of said intermediate layer so as to planarize it, said polishing involving
      1) attaching said substrate to a substrate holder, and
      2) wiping said exposed surface with a nonabrasive etchant; and
   d) forming a second circuit pattern on said substrate.

4. A method as recited in claim 3 wherein said etchant is a copper etchant.

5. A method as recited in claim 3 wherein the exposed surface is wiped with etchants having consecutively diminishing strengths.

* * * * *